(12) United States Patent
Huguet et al.

(10) Patent No.: US 9,428,844 B2
(45) Date of Patent: Aug. 30, 2016

(54) CRUCIBLE FOR SOLIDIFYING A SILICON INGOT

(71) Applicant: COMMISSARIAT A L'ENERGIE ATOMIQUE ET AUX ENERGIES ALTERNATIVES, Paris (FR)

(72) Inventors: Charles Huguet, Paris (FR); Severine Bailly, La Motte-Servolex (FR); Virginie Brize, Saint Martin d'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/375,757

(22) PCT Filed: Jan. 31, 2013

(86) PCT No.: PCT/IB2013/050825
§ 371 (c)(1),
(2) Date: Jul. 30, 2014

(87) PCT Pub. No.: WO2013/114313
PCT Pub. Date: Aug. 8, 2013

(65) Prior Publication Data
US 2015/0020545 A1   Jan. 22, 2015

(30) Foreign Application Priority Data
Jan. 31, 2012  (FR) ..................... 12 50903

(51) Int. Cl.
| | |
|---|---|
| *C30B 35/00* | (2006.01) |
| *C30B 15/10* | (2006.01) |
| *C30B 28/04* | (2006.01) |
| *C30B 29/06* | (2006.01) |
| *C04B 41/87* | (2006.01) |
| *C04B 41/00* | (2006.01) |
| *C04B 41/50* | (2006.01) |
| *C01B 33/021* | (2006.01) |
| *C09D 1/00* | (2006.01) |
| *C04B 111/00* | (2006.01) |

(52) U.S. Cl.
CPC ........... *C30B 35/002* (2013.01); *C01B 33/021* (2013.01); *C04B 41/009* (2013.01); *C04B 41/5066* (2013.01); *C04B 41/87* (2013.01); *C09D 1/00* (2013.01); *C30B 15/10* (2013.01); *C30B 28/04* (2013.01); *C30B 29/06* (2013.01); *C30B 35/00* (2013.01); *C04B 2111/00879* (2013.01)

(58) Field of Classification Search
CPC .................. C30B 1/00; C09D 1/00

USPC ....................................... 65/374.13
See application file for complete search history.

(56) References Cited

U.S. PATENT DOCUMENTS

| | | | | |
|---|---|---|---|---|
| 5,438,025 A | * | 8/1995 | Leung ................. | C03C 10/0009 501/87 |
| 2009/0286086 A1 | * | 11/2009 | Dierdorf ............. | C09D 183/16 428/412 |
| 2013/0247334 A1 | | 9/2013 | Huguet et al. ............ | 23/295 R |

FOREIGN PATENT DOCUMENTS

| | | |
|---|---|---|
| WO | EP 0 411 611 | 2/1991 |
| WO | WO 2012/025905 | 3/2012 |
| WO | WO 2013/114313 | 8/2013 |

OTHER PUBLICATIONS

Bill J. et al., "Polymer-derived ceramic coatings on C/C-SiC composites", J. European Ceramic Society, 16(1996) 1115-1120.
Buonassisi et al., "Transition metals in PV-grade ingot-cast multicrystalline silicon: Assessing the role of impurities in Si3N4 crucible lining material", J. Crystal Growth 287 (2006) 402-407.
C. Vakifahmetoglu et al., "Ceramic foams and micro-beads from emulsions of a preceramic polymer", J. European Ceramic Society 31 (2011) 1481-1490.
International Search Report in International Application No. PCT/IB2013/050825. Dated Jul. 18, 2013 (English).
Kojima et al., "Characteristics of polysilazane compound and its application as coating for carbon material", J. Materials Science Letters 21 (2002) 757-760.
Kroke E: "Silazane derived ceramics and related materials," Materials Science and Engineering R: Reports. vol. 26, No. 4-6. Apr. 1, 2000. pp 97-199.
T. Ohishi, "Gas barrier characteristics of a polysilazane film formed on an ITO-coated PET substrate", J. Non-Crystalline Solids 330 (2003) 248-251.
T.-H. Ho et al., "Modification of epoxy resins with polysiloxane thermoplastic polyurethane for electronic encapsulation", Polymer, 37 (1996) 2733-2742.

* cited by examiner

*Primary Examiner* — Mark Halpern
(74) *Attorney, Agent, or Firm* — Norton Rose Fulbright US LLP

(57) ABSTRACT

The present invention concerns a crucible for solidifying a silicon ingot from molten silicon, characterized in that it is coated at least partially on the inner surface thereof with an outer layer provided in the form of a stack of laminations, each lamination having a thickness varying from 5 to 150 μm, and being formed from a material obtained by thermal decomposition of polysilazane(s) and/or polysiloxane(s) and wherein inorganic particles are embedded having a size varying from 50 μm to 200 μm. The present invention further concerns a method for preparing such crucibles.

23 Claims, No Drawings

CRUCIBLE FOR SOLIDIFYING A SILICON INGOT

CROSS-REFERENCE TO RELATED APPLICATIONS

This application is a national phase application under 35 U.S.C. §371 of International Application No. PCT/IB2013/050825 filed 31 Jan. 2013, which claims priority to French Patent Application No. 1250903 filed 31 Jan. 2012. The entire contents of each of the above-referenced disclosures is specifically incorporated herein by reference without disclaimer.

The present invention relates to a crucible of use for solidifying a silicon ingot from molten silicon.

It also relates to a process for preparing such a crucible and also to the use of such a crucible for treating molten silicon.

The crucibles according to the invention may especially be used in processes for melting and solidifying silicon, for the purpose, for example, of obtaining high-purity silicon for applications in the generation of photovoltaic energy.

Photovoltaic cells are, for the most part, made from monocrystalline or polycrystalline silicon, obtained from the solidification of liquid silicon in crucibles. It is the wafers cut from the ingot formed within the crucible that are used as the basis for the manufacture of the cells.

The crucibles considered for the growth of the ingot are generally silica crucibles, coated with a layer of oxidized silicon nitride to prevent the ingot adhering to the crucible after solidification.

More specifically, this non-stick behavior is based, for the most part, on the presence of silicon nitride, $Si_3N_4$, in the form of oxidized powders, at the surface of the inner walls of the crucibles to which the silicon adheres while it cools. While cooling, the silicon ingot detaches from these walls by cohesive failure within the silicon nitride layer, thus relaxing the mechanical stresses resulting from the difference in the thermal expansion coefficients.

However, this technique does not make it possible to prevent contamination of the silicon by the impurities present in the silicon nitride powder [1]. For obvious reasons, this contamination, capable of existing at the zones of the silicon ingot formed in direct contact with or nearby the walls of the crucible, renders the ingot partly unsuitable for use in photovoltaic applications.

Therefore to date there remains a need for solidification crucibles that make it possible to easily detach the silicon ingot after it has cooled, while limiting the contamination of this ingot by the non-stick coating.

There also remains a need for such solidification crucibles that are, in addition, reusable.

Lastly, from the viewpoint of industrial-scale production, it is desirable to propose a process for manufacturing such crucibles by low-cost techniques that only require a limited number of preparation steps.

The present invention specifically aims to propose novel crucibles, of use for solidifying a silicon ingot from molten silicon, which meet these expectations.

The inventors have, indeed, discovered that the aforementioned problems of contamination can be solved by forming, at the surface of the inner walls of a conventional crucible, a coating in the form of a stack of strata formed from polysilazane(s) and/or polysiloxane(s) and inorganic particles.

Thus, the present invention relates, according to a first of its aspects, to a crucible of use for solidifying a silicon ingot from molten silicon, characterized in that it is coated at least partially on its inner surface with an outer layer that is in the form of a stack of strata, each stratum having a thickness varying from 5 to 150 µm, and being formed from a material obtained by thermal decomposition of polysilazane(s) and/or polysiloxane(s) and into which inorganic particles having a size that varies from 50 nm to 200 µm are incorporated.

Within the meaning of the invention, the expression "inner surface" is understood to denote the outer surface of the walls defining the internal volume of the crucible. The "internal volume of the crucible" denotes, within the meaning of the invention, the volume defined by the bottom surface and the sidewalls of the base body of the crucible or the outer surfaces of the base body of the crucible.

The "outer" layer is understood to denote the fact that the layer formed is in direct contact with the surrounding atmosphere and/or the container of the crucible, that is to say that it does not itself have any coating on its surface opposite the walls of the crucible.

Polysilazanes are organosilicon polymers, the main backbone of which consists of a sequence of silicon and nitrogen atoms.

These polymers are already proposed as pro-ceramic materials in view of their ability to form, by thermal decomposition, a ceramic material composed mainly of silicon, carbon and nitrogen atoms.

Such compounds are in particular already used for the purpose of forming at the surface of various substrates, such as for example those made of graphite or of silica, a coating endowed with antioxidant and impermeability properties ([2], [3]).

Polysilazane containing inorganic powders has already been used as a material for increasing the oxidation resistance of certain carbon-based substrates. However, the processes proposed for its implementation consist of the formation, on the surface of the material to be treated, of a monolayer that is derived from the thermal decomposition, by pyrolysis, of the previously deposited polysilazane ([4], [5]).

As regards polysiloxanes, these are organosilicon polymers, the main backbone of which consists of a sequence of silicon and oxygen atoms.

These polymers are very widely used in all microelectronics fields as photoresists, as lithographic masks or else as encapsulants [6]. Many authors have also disclosed techniques for obtaining materials with controlled geometries via emulsion techniques starting from polysiloxanes [7].

However, to the knowledge of the inventors, a crucible coating according to the invention, formed from a stack of strata, each stratum being formed from a material obtained by thermal decomposition of polysilazane(s) and/or polysiloxane(s) and into which inorganic particles are incorporated, has never been proposed.

Thus, the outer layer according to the invention has a stratified structure, with regard to the fact that it is formed from at least two, or even several, strata that are superposed and positioned parallel to the treated inner surface of said crucible.

For the purposes of simplification, a layer in accordance with the invention could also be equally denoted in the text as being "a stack of strata", "outer layer" or "coating layer".

In particular, the outer layer according to the invention may have a thickness ranging from 10 to 500 µm, preferably from 50 to 300 µm and more particularly from 100 to 200 µm.

According to another of its aspects, the present invention aims to propose a process for forming a high-purity non-stick coating on the inner surface of a crucible of use for solidifying a silicon ingot from molten silicon, characterized in that said coating is obtained via (a) the formation of at least one first stratum by:

- (i) bringing the inner surface of said crucible into contact with a solution comprising at least one polysilazane and/or one polysiloxane, and additionally containing a particulate material, the particles of which have a size varying from 50 nm to 200 µm, in particulate material/polysilazane and/or polysiloxane proportions ranging from 10% to 70% by volume, preferably from 40% to 50% by volume;
- (ii) condensation-crosslinking of said solution by heat treatment;
- (iii) where appropriate a pre-pyrolysis in air;
- (iv) pyrolysis under controlled atmosphere and controlled temperature and, optionally;
- (v) oxidation annealing;
- followed by (b) the formation of at least one new stratum, contiguous to the stratum formed in step (a), by reproducing steps (i), (ii), optionally (iii), (iv) and, optionally, (v);
- the pyrolysis of step (iv) being carried out at a temperature of at least 500° C. for at least 1 hour.

Of course, the total number of strata in the stack according to the invention will depend on the number of repetitions of step (b) indicated previously. This number of strata will thus be able to be adjusted with respect to the desired thickness of the stack and the desired properties.

According to one embodiment, the formation of at least one of said strata comprises the pre-pyrolysis step (iii).

The pre-pyrolysis may be carried out at a temperature ranging from 270° C. to 700° C., preferably from 400° C. to 600° C. Under these circumstances, the pyrolysis step (iv) is carried out at a temperature above 700° C.

According to another of its aspects, the present invention aims to propose a process for forming a high-purity non-stick coating on the inner surface of a crucible of use for solidifying a silicon ingot from molten silicon, characterized in that said coating is obtained via

- (a) the formation of at least one stratum according to a treatment comprising:
  - (1) at least once the sequence of the steps:
    - (i) bringing the inner surface of said crucible into contact with a solution comprising at least one polysilazane and/or one polysiloxane, and additionally containing a particulate material, the particles of which have a size varying from 50 nm to 200 µm, in particulate material/polysilazane and/or polysiloxane proportions ranging from 10% to 70% by volume, preferably from 40% to 50% by volume;
    - (ii) condensation-crosslinking of said solution by heat treatment; and
    - (iii) optionally a pre-pyrolysis in air at a temperature ranging from 270° C. to 700° C.;
  - (2) a pyrolysis under controlled atmosphere and controlled temperature, at a temperature above 700° C. for at least 1 hour and, optionally;
  - (3) an oxidation annealing; followed by
- (b) the superposing of one or more consecutive strata on the stratum formed in step (a), each stratum being formed by repeating at least once the sequence of steps (i), (ii) and optionally (iii), followed by step (2) and optionally step (3).

According to a preferred variant, the sequence of steps considered in (1) inevitably comprises a pre-pyrolysis step.

The formation of an outer layer according to the invention proves particularly advantageous in several respects.

Firstly, such a layer in the form of a stack of strata advantageously has non-stick properties with respect to solid silicon and makes it possible to guarantee an increased level of purity to the corresponding silicon ingot.

As demonstrated in the examples that follow, the crucibles according to the invention enable easy detachment of the solidified silicon ingots, and this while significantly reducing the pollution thereof by the non-stick coating. A silicon ingot formed in contact with this stack detaches therefrom, for the most part, by cohesive failure within said stack. The crucibles according to the invention may thus be reused a large number of times without impairing their properties and prove, in this respect, particularly advantageous at an industrial level.

The non-stick properties of the crucibles according to the invention are in particular obtained via the presence of the oxidized porous layer, the deoxidation kinetics of which are slow enough to prevent infiltration of liquid silicon in the layer up to contact with the substrate, and therefore to enable its detachment from the substrate.

Furthermore, the inventors have observed, advantageously, that the addition of the particulate material, the particles of which have a size ranging from 50 nm to 200 µm, to the solution of polysilazane(s) and/or polysiloxane(s) makes it possible, by limiting the intrinsic shrinkage of the material of the layer during the heat treatment thereof according to the invention, to attain thick strata, more particularly having a thickness ranging from 5 to 150 µm.

It is thus possible to obtain, according to the invention, a layer having a satisfactory thickness by forming a limited number of strata in accordance with the invention. In particular, the stack of strata in accordance with the invention may comprise from 2 to 8 strata, said strata being superposed and contiguous. Within the meaning of the invention, the term "contiguous" signifies that the strata in question are placed side-by-side and adjoining. The large thickness of the strata formed according to the invention thus enables a reduction in the number of steps necessary for producing the coating for the crucibles, which is a particularly deciding factor in the implementation of the process for preparing crucibles on an industrial scale.

Equally, the process of the invention deposits the non-stick coating in liquid form, according to conventional and inexpensive techniques, that make it possible to achieve a very good surface finish.

Other features, advantages and methods of application of the crucible and of the process according to the invention will emerge more clearly on reading the description which follows, given by way of non-limiting illustration.

In the remainder of the text, the expressions "between . . . and . . . ", "ranging from . . . to . . . " and "varying from . . . to . . . " are equivalent and are understood to signify that the limits are included, unless otherwise mentioned.

Unless otherwise mentioned, the expression "containing/comprising a(n)" should be understood as "containing/comprising at least one".

Coating

As indicated previously, the crucibles according to the invention are coated at least partially on their inner surface with an outer layer formed from a stack of strata, each of the strata being formed from a material obtained by thermal decomposition of polysilazane(s) and/or polysiloxane(s) into which inorganic particles are incorporated.

According to a first embodiment variant of the invention, the material forming a stratum in accordance with the invention derives from the thermal decomposition of polysilazane(s).

The polysilazanes suitable for the invention may be represented by the following formula —(SiR'R"—NR''')$_n$—(SiR*R—NR*)$_p$—, in which R', R", R''', R*, R and R* represent, independently of one another, a hydrogen atom or a substituted or unsubstituted alkyl, aryl, vinyl or (trialkoxysilyl)alkyl radical, n and p having values such that the polysilazane has an average molecular weight ranging from 150 to 150 000 g/mol.

Such polysilazanes are in particular described in document US 2009/0286086.

According to another embodiment variant of the invention, the material forming a stratum in accordance with the invention derives from the thermal decomposition of polysiloxane(s).

The polysiloxanes suitable for the invention may be represented by the following formula (SiR$_1$R$_2$—O)$_k$—(SiR$_3$R$_4$—O)$_m$ in which R$_1$, R$_2$, R$_3$ and R$_4$ represent, independently of one another, H, CH$_3$, C$_2$H$_5$, C$_6$H$_5$, CH$_2$=CH—, etc., k and m are between 1 and 1000.

Such polysiloxanes are for example described in document CA 1296468.

The material obtained by thermal decomposition of polysilazane(s) and/or polysiloxane(s) is based on Si and on one or more elements chosen from C, N and O.

More particularly, the material obtained by thermal decomposition of polysilazane(s) and/or polysiloxane(s) may be based on silicon carbide (SiC), silicon nitride (Si$_3$N$_4$), silica (SiO$_2$), silicon oxycarbonitride and/or silicon oxycarbide (SiOC).

Silicon oxycarbonitride is understood to denote compounds of general formula Si$_x$O$_y$N$_z$C$_w$, such as for example those described in the document U.S. Pat. No. 5,438,025, such as for example SiNCO$_2$ or SiN$_{0.52}$O$_{1.45}$C$_{0.32}$.

The material forming each stratum in accordance with the invention derives more particularly from a heat treatment, of pyrolysis type, of polysilazane(s) and/or polysiloxane(s), as expanded upon more particularly below.

Inorganic Particles

As indicated previously, the material forming the strata of the coating layer of the crucible according to the invention comprises inorganic particles, the size of which varies from 50 nm to 200 µm.

Preferably, the dimensions of said inorganic particles vary from 500 nm to 50 µm, preferably from 0.8 µm to 10 µm.

The inorganic particles may be more particularly selected from silicon (Si) particles that are optionally surface oxidized, boron nitride (BN) particles, silicon nitride (Si$_3$N$_4$) particles, silicon carbide (SiC) particles, silicon oxycarbide (SiOC) particles, silica (SiO$_2$) particles, silicon oxycarbonitride (SiNCO) particles, silicon and boron carbonitride (SiBCN) particles, and mixtures thereof.

According to one particularly preferred embodiment, said inorganic particles are of the same chemical nature as the material forming the stratum or the strata containing them.

According to one particular embodiment, said inorganic particles are formed from silicon oxycarbide (SiOC).

According to another particular embodiment, they are particles formed predominantly from silica (SiO$_2$). The term "predominantly" is understood to signify that the particles are formed from at least 90% by weight of silica, preferably from at least 95% by weight of silica.

According to yet another particular embodiment, they may be silicon particles that are optionally surface oxidized.

The inorganic particles used in the process for preparing the coating according to the invention, as described more particularly below, may be in the form of a powder.

According to one embodiment variant, they may be commercially available powders. By way of example of such powders, mention may be made of:
- the silicon nitride (Si$_3$N$_4$) sold under the reference SNE10® by the company UBE,
- the silicon sold in crystalline/amorphous silicon powder form under the reference 38715 by the company Alfa Aesar, and
- the silicon carbide (SiC) sold in α-SiC powder form under the reference UF15SiC by the company H.C. Starck.

According to another embodiment variant, the inorganic particles may be prepared prior to the formation of the coating according to the invention. A person skilled in the art is able to implement methods compatible with the preparation of the nanoparticles suitable for the invention.

Advantageously, the inorganic particles according to the invention may be formed from polysilazane(s) and/or polysiloxane(s).

Surprisingly, the inventors have discovered that the use of such particles formed from polysilazane(s) and/or polysiloxane(s) within the solution of polysilazane(s) and/or polysiloxane(s) in order to form a stratum according to the invention, made it possible to achieve improved purities of the deposited material layer. The use, within a liquid phase, of particles derived from the same material, as described more particularly below for the process of the invention, in order to attain a coating layer was in no way obvious. Indeed, it could be expected that the incorporation of particles based on a material that intrinsically has a shrinkage identical to that of the coating material would result in too much cracking of the layer during the heat treatment thereof.

In this case, a powder of particles suitable for the invention may for example be formed via an emulsion process based on polysilazane(s) and/or polysiloxane(s), as described by Vakifahmetoglu et al. [7].

Particles suitable for the invention may also be formed via a process of milling solid pyrolyzed polysilazane and/or polysiloxane, with a planetary mill, the components of which are made of ultra pure agate or of Si$_3$N$_4$. By way of planetary mill, mention may especially be made of that sold under the reference PM100 by the company Retsch.

Advantageously, controlling the amount of particles incorporated, obtained for example via a mixed emulsion process or via a milling (microcracking) operation makes it possible to envisage controlling the porosity of the coating, and therefore the mechanical properties of the adherent layer, and the detachment physics of the ingot. Specifically, blind microcracks develop around the particles which increase the blind porosity of the material, favorable to the detachment mechanism during cooling.

Stack of the Strata

As indicated previously, the outer layer forming the coating of the crucible according to the invention is formed from a stack of strata.

Preferably, the outer layer comprises from 2 to 8 strata, in particular from 4 to 6 strata.

The outer layer may have a thickness ranging from 10 to 500 µm, in particular from 50 to 300 µm, preferably from 100 to 200 µm.

Each of the strata constituting the layer is formed from a material obtained by thermal decomposition of polysilazane(s) and/or polysiloxane(s), in particular as described previously, and incorporated into which are inorganic particles, preferably as described previously.

Each of the strata more particularly has a thickness varying from 5 to 150 µm, preferably from 10 µm to 50 µm.

The thickness of the strata and of the outer layer may be determined in a conventional manner by scanning electron microscopy (SEM).

As expanded upon below, the material forming each stratum in accordance with the invention derives from a pyrolysis-type heat treatment of polysilazane(s) and/or polysiloxane(s).

By adjusting the pyrolysis conditions, in terms of temperature hold, temperature rate and temperature maintenance and/or nature of the atmosphere used during the pyrolysis, for example argon or nitrogen, it proves possible, on the one hand, to attain materials of particular composition for a given stratum and therefore to produce a stack of strata of identical or different chemical nature and, on the other hand, to modulate the structural organization of each of the strata.

According to a first embodiment variant, all of the strata constituting the coating layer may be formed from one and the same material.

According to another embodiment, at least two strata of said layer may be formed from different materials. In this second embodiment, two strata constituted of the same materials may have different compositions, in view, for example, of different conditions used for forming each of the corresponding strata.

According to one particular embodiment, one or more of the strata, or even all of the strata constituting the coating layer according to the invention is/are formed from a material obtained by thermal decomposition of polysilazane(s), incorporated into which are inorganic particles, in particular selected from silicon oxycarbide particles, silica particles, silicon nitride particles or silicon oxycarbonitride particles.

The material of the strata derived from the thermal decomposition of polysilazane(s) and/or polysiloxane(s) may be, at least partly, in amorphous form.

The term "amorphous" is understood, in the crystallographic sense, to mean a material in which the atoms lack any medium-range and long-range order, which distinguishes it from crystalline materials. The characterization is carried out by x-ray analysis (XRD).

The morphological characteristics of the strata obtained according to the invention will depend of course on the conditions of their formation, and in particular on the nature of the deposition solution and also on the parameters used for the heat treatment and in particular on the temperature.

Generally, the strata formed according to the invention are in the form of non-touching tiles.

Thus, according to one particular embodiment, one or more of the strata, or even all of the strata forming the outer layer are in the form of non-touching tiles.

The lateral spacing between the tiles may be between 0.1 µm and 50 µm, more specifically between 0.1 µm and 20 µm, in particular from 0.5 µm to 10 µm, and preferably from 0.5 µm to 5 µm.

The lateral dimension of the tiles may be between 10 µm and 800 µm, for example between 100 µm and 500 µm. The lateral dimension of the tiles and also the lateral spacing between two tiles may be determined in a conventional manner by scanning electron microscopy (SEM).

A tile is characterized by a thickness dimension of less than its lateral dimension (length, width, diameter).

According to the invention, the lateral dimension/thickness dimension ratio of the tiles may be between 1.2 and 200.

Due to the use of a particulate material, the coating layer according to the invention generally has an inhomogeneous surface appearance.

The layer that is in the form of a stack of non-touching tiles in accordance with the invention is also characterized by its shear strength, which must be greater than 1 Pa and less than or equal to 500 MPa.

Within the meaning of the invention, the "shear strength" of a layer is understood to denote the mechanical strength at a stress developed in the plane of the layer.

It is in contrast with a tensile strength which would, on the other hand, be the strength at a stress developed perpendicular to the plane of the stack layer.

This shear strength parameter may be determined by any conventional technique known to a person skilled in the art, and especially by the measurement defined in the standard ASTM D1002, for example by means of the eXpert 2611 machine from the manufacturer ADMET.

The layer in accordance with the invention must not be subject to a disintegration or crumbling phenomenon during simple handling of the crucible. Similarly, it must not be impaired by the stresses induced during the melting of the silicon charge, especially those induced by natural convection.

Thus, the layer in accordance with the invention has a shear strength greater than 1 Pa, for example greater than 10 kPa, especially greater than 50 kPa.

Furthermore, the layer in accordance with the invention must also have a shear strength lower than the stress induced by the difference in thermal expansion between the silicon undergoing solidification and the substrate of the crucible.

Preferably, the layer in accordance with the invention has a shear strength lower than the critical shear stress of the silicon, that is to say lower than the minimum stress that favors the appearance of dislocations of the silicon when the latter is in its plasticity domain.

Indeed, this makes it possible to facilitate in particular the detachment of the silicon ingot during the cooling thereof within the crucible, and to also limit the appearance of defects, in particular of dislocations.

In particular, the layer in accordance with the invention may have a shear strength less than or equal to 300 MPa, for example less than or equal to 200 MPa, for example less than or equal to 100 MPa, for example less than or equal to 5 MPa.

Process

As specified above, according to another of its aspects, the present invention aims to propose a process for forming a high-purity non-stick coating on the inner surface of a crucible of use for solidifying a silicon ingot from molten silicon, characterized in that said coating is obtained via (a) the formation of at least one first stratum by:

(i) bringing the inner surface of said crucible into contact with a solution comprising at least one polysilazane and/or one polysiloxane, and additionally containing a particulate material, the particles of which have a size varying from 50 nm to 200 µm, in particulate material/polysilazane and/or polysiloxane proportions ranging from 10% to 70% by volume, preferably from 40% to 50% by volume;

(ii) condensation-crosslinking of said solution by heat treatment;
(iii) where appropriate a pre-pyrolysis in air;
(iv) pyrolysis under controlled atmosphere and controlled temperature and, optionally;
(v) oxidation annealing;
followed by (b) the formation of at least one new stratum, contiguous to the stratum formed in step (a), by reproducing steps (i), (ii), optionally (iii), (iv) and, optionally, (v);
the pyrolysis of step (iv) being carried out at a temperature of at least 500° C. for at least 1 hour.

Of course, the total number of strata in the stack according to the invention will depend on the number of repetitions of step (b) indicated previously. This number of strata will thus be able to be adjusted with respect to the desired thickness of the stack and the desired properties.

As specified previously, steps (i), (ii), optionally (iii), (iv) and, optionally, (v) may be repeated between 2 and 8 times, so as to form a stack of 2 to 8 strata.

According to one embodiment, the formation of at least one of said strata comprises the pre-pyrolysis step (iii).

The pre-pyrolysis may be carried out at a temperature ranging from 270° C. to 700° C., preferably from 400° C. to 600° C. Under these circumstances, the pyrolysis step (iv) is carried out at a temperature above 700° C.

According to one embodiment, the pyrolysis step of one of steps (a) and (b) is carried out under a reactive atmosphere, which is reactive with respect to the material that is derived from the polysilazane and/or polysiloxane, for example under nitrogen or in air, the other step being carried out under an inert atmosphere, for example under argon.

This results in the formation of two strata formed of different materials, for example as defined previously.

The expression "reproducing . . . steps" or "repeating . . . steps" is understood within the meaning of the invention to mean that the series of steps in question is reproduced, but the conditions for implementing each of the steps may differ for the formation of each stratum.

Thus, each stratum formed according to step (b) may consist of different or identical materials or require the use of different pre-pyrolysis and/or pyrolysis temperatures and/or times.

According to yet another of its aspects, the present invention aims to propose a process for forming a high-purity non-stick coating on the inner surface of a crucible of use for solidifying a silicon ingot from molten silicon, characterized in that said coating is obtained via
(a) the formation of at least one stratum according to a treatment comprising:
(1) at least once the sequence of the steps:
(i) bringing the inner surface of said crucible into contact with a solution comprising at least one polysilazane and/or one polysiloxane, and additionally containing a particulate material, the particles of which have a size varying from 50 nm to 200 μm, in particulate material/polysilazane and/or polysiloxane proportions ranging from 10% to 70% by volume, preferably from 40% to 50% by volume;
(ii) condensation-crosslinking of said solution by heat treatment; and
(iii) optionally a pre-pyrolysis in air at a temperature ranging from 270° C. to 700° C.;
(2) a pyrolysis under controlled atmosphere and controlled temperature, at a temperature above 700° C. for at least 1 hour and, optionally;
(3) an oxidation annealing; followed by
(b) the superposing of one or more consecutive strata on the stratum formed in step (a), each stratum being formed by repeating at least once the sequence of steps (i), (ii) and optionally (iii), followed by step (2) and optionally step (3).

Bringing the solution of polysilazane(s) and/or polysiloxane(s) into contact with the inner surface of said crucible in step (i) may be carried out by any conventional technique known to a person skilled in the art. For example it may be deposited by dip coating, spin coating, spray coating or else using a brush.

Preferably, it is carried out by spraying the solution onto the inner surface of the crucible.

The use of a liquid phase makes it possible to produce a deposit having a very good surface finish.

According to one embodiment, the solution from step (i) may also comprise a solvent for example an aprotic anhydrous solvent and, where appropriate, a polymerization initiator, for example of organic peroxide type.

As aprotic anhydrous solvent, mention may especially be made of toluene, dimethylformamide, dimethyl sulfoxide and dibutyl ether.

As polymerization initiator, mention may especially be made of dicumyl peroxide, diperoxyester, peroxycarbonate or zirconium acetyl acetate.

The morphological characteristics of the strata obtained according to the invention depend especially on the viscosity of the polysilazane and/or polysiloxane solution deposited, and consequently especially on the concentration of polysilazane and/or polysiloxane in this solution.

Preferably, the polysilazane and/or polysiloxane solution used according to the invention comprises from 10% to 90% by weight of polysilazane(s) and/or polysiloxane(s) with respect to the total weight of said solution, in particular from 20% to 80% by weight, and more particularly from 40% to 60%.

According to one particular embodiment of the invention, the formation of at least one of said strata according to the processes described above comprises the pre-pyrolysis step (iii).

Preferably, the formation of each of the strata of said non-stick coating comprises the pre-pyrolysis step (iii).

Advantageously, the pre-pyrolysis step (iii) is carried out at a temperature ranging from 400° C. to 600° C.

The pre-pyrolysis step (iii) may be carried out for a time ranging from 5 minutes to 1 hour, preferably from 15 to 30 minutes.

According to one sub-embodiment of this embodiment, the formation of at least one stratum involving the implementation of steps (i), (ii) and (iii) comprises, prior to the implementation of step (2), the repetition, at least once, of steps (i), (ii) and (iii).

This sub-embodiment advantageously makes it possible to reduce the time and also the energy cost necessary for the formation of a stratum of a given thickness.

Preferably, when the formation of all of the strata of the coating involves the implementation of steps (i), (ii) and (iii), the formation of each of said strata comprises, prior to the implementation of step (iv), the repetition, at least once, of steps (i), (ii) and (iii).

Each repetition of steps (i), (ii) and (iii) constitutes the formation of a sub-stratum. One stratum may thus comprise a certain number of sub-strata depending on the number of repetitions of steps (i) to (iii).

One stratum may comprise from 2 to 8 sub-strata, preferably from 3 to 6 sub-strata, in particular 4 sub-strata.

The conditions for implementing each of steps (i) to (iii) may be identical or different for the formation of each sub-stratum of one and the same stratum.

Thus, two sub-strata of one and the same stratum may be formed from different or identical materials.

Preferably, each sub-stratum of one and the same stratum is obtained by reproducing steps (i) to (iii) with the same implementation conditions. In this case, each sub-stratum is formed from identical materials.

When the strata are formed of sub-strata, the outer layer according to the invention may comprise from 2 to 8 strata, preferably from 2 to 4 strata, in particular 2 strata.

The pyrolysis step (2) is carried out under a controlled atmosphere, for example under an atmosphere constituted of argon, nitrogen or air, preferably argon.

Typically, this treatment comprises at least one hold of at least one hour at at least 1000° C., optionally preceded by a low-temperature annealing, for example of one to two hours, between 100° C. and 200° C.

It is understood that this low-temperature annealing corresponds to the condensation-crosslinking step (ii) of the process according to the invention.

An additional step of oxidation annealing in air may also be carried out.

This annealing step has a very particular advantage when the solution used is a solution of polysilazane(s) and when the pyrolysis step is carried out under an atmosphere constituted of argon, nitrogen or aqueous ammonia. Specifically, the material obtained is then either SiC, or $Si_3N_4$, or a material of intermediate composition of oxycarbonitride type. It may be advantageous to oxidize this material in order to impart to it its non-wetting property with respect to the liquid silicon.

When the pyrolysis step is carried out under an atmosphere constituted of air, the annealing step has a lesser advantage since the material obtained is already oxidized at the end of the pyrolysis.

The invention may be advantageously carried out on any type of conventional crucible, and for example on crucibles constituted of a dense ceramic substrate, for example made of silicon carbide (SiC), silicon nitride ($Si_3N_4$) or silica ($SiO_2$), or of a porous substrate, for example made of graphite, optionally covered with an impermeabilizing layer (for example made of silicon carbide).

Preferably, a substrate will be chosen that is made of graphite, and especially made of isostatic, pyrolytic, vitreous, fibrous, carbon-carbon composite or flexible graphite that advantageously has a good temperature resistance.

According to one embodiment, in particular when the crucible used consists of a porous substrate, in particular made of graphite, the crucible may also comprise, at least partially on its inner surface, an intermediate insulating layer.

This intermediate insulating layer is then located between the inner surface of the crucible and the outer coating layer in accordance with the invention.

Such an intermediate insulating layer is intended for insulating said substrate from the coating layer.

As it emerges from what follows, this layer is generally formed, at least partially, on the inner surface of said crucible prior to the formation of the outer layer according to the invention.

This intermediate insulating layer affixed to the surface of the material forming said crucible could especially be a dense and continuous layer of ceramic capable of providing barrier, or even antioxidant, behavior.

Such insulating layers are well known to a person skilled in the art.

According to one embodiment, this intermediate insulating layer may be formed from at least two different materials, alternately constituting this insulating layer.

In particular, the first type of one of the materials may be formed predominantly, or even solely, from silica ($SiO_2$), and the other material may be formed predominantly, or even solely, from silicon carbide (SiC).

According to one embodiment variant, the process of the invention may thus comprise, within the context of the use of a crucible consisting of a porous substrate, in particular of graphite, prior to the aforementioned steps (a) and (b), a step of forming an intermediate insulating layer on the inner surface of said crucible as described previously.

The process according to the invention makes it possible to limit, or even to prevent, the contamination of the silicon ingot, and to thus obtain silicon ingots of greater purity with respect to those obtained to date, while using conventional and inexpensive deposition techniques.

Thus, the average purity of the coatings based on polysilazane(s) and/or polysiloxane(s) according to the invention is greater than 99.99% by weight, in particular greater than 99.996% by weight, i.e. much greater than that of the conventional coatings obtained from powders, for example from $Si_3N_4$ powders that have purities of less than 99.96%, or even of the order of 98%.

The invention will now be described by means of the following examples given of course by way of illustrative and nonlimiting example of the invention.

EXAMPLES

Example 1

The crucible used is a crucible made of sintered silica (Zyarock™) from the company Vesuvius, having an internal diameter of 150 mm and an internal height of 150 mm.

Preparation of the Particulate Material

The particulate material is obtained from a dropwise emulsion process according to the following protocol. A mixture of 5 g of polysiloxane and of 7 mL of toluene, containing 0.16 g of zirconium acetyl acetate as liquid-phase polymerization catalyst is added dropwise to 80 mL of water containing polyethylene glycol sorbitan monooleate (Tween 80) and a surfactant, with stirring (for 15 minutes).

The polymerization of the polysiloxane takes place in the liquid phase under vigorous stirring.

After drying the suspension thus obtained (for 12 h on a hot plate at 140° C.), a pyrolysis step at 1200° C. for 4 hours under a nitrogen atmosphere takes place in order to set the structure of the material.

A material of amorphous SiOC composition in the form of microbeads having a size of less than about 10 microns is then obtained. The treatment at limited temperature made it possible not to initiate the sintering process of the powders. Thus, during the mixing of the compact powder in solution, simple magnetic stirring makes it possible to recreate a suspension of homogenous particles.

Formation of the Crucible Coating

A multi-strata layer according to the invention or else a stack of non-touching tiles according to the invention was formed on this crucible, according to the following protocol.

The powder previously formed is dispersed in a solution (in a powder/solution volume ratio of 50/50) containing 80% by weight of polysilazane (Ceraset PSZ20™ from the company CLARIANT) in dibutyl ether under vigorous stirring.

The suspension obtained is then sprayed onto the inner surface of the crucible, then a pyrolysis is carried out in air for 2 hours at 1000° C., preceded by a low-temperature annealing (150° C. for 2 hours).

This series of steps (spraying/low-temperature annealing/pyrolysis) is repeated 4 times in order to obtain the final layer. The layer deposited has a thickness of around 100 μm estimated by optical microscopy.

Formation of a Silicon Ingot in the Crucible Having the Coating

The crucible according to the invention thus formed is tested as follows:

800 g of electronic quality silicon are deposited, manually and very carefully, in the resulting crucible. The silicon is then melted according to the following cycle: temperature increase at a rate of 200° C. per hour up to 1000° C. under low vacuum, followed by a hold for a duration of one hour with introduction of a circulating argon atmosphere (flow rate 0.7 l/min), then temperature increase at a rate of 150° C. per hour up to 1500° C. and maintenance at this temperature for 6 hours, and finally decrease at a rate of 50° C. per hour down to 1200° C. The cooling then takes place freely down to ambient temperature.

After complete cooling, the silicon ingot thus formed detaches from the crucible in accordance with the invention without any effort and without exhibiting any cracks.

Example 2

The crucible used is the same as in the preceding example.

Preparation of the Particulate Material

The particulate material is obtained from micron-sized silicon powder (reference 38715 from the company Alfa Aesar), having a size (indicated by the supplier) of less than 5 μm. The powder is oxidized in Zero Air (Air Products) in a silica resistance furnace, at 1000° C. for 30 minutes. The thickness of oxide at the surface of the grains is estimated by transmission electron microscopy (TEM) at about one hundred nanometers.

Formation of the Crucible Coating

A multi-strata layer according to the invention or else a stack of non-touching tiles according to the invention was formed on this crucible, according to the following protocol.

The powder previously formed is dispersed in a solution (in a powder/solution volume ratio of 50/50) containing 80% by weight of polysilazane (Ceraset PSZ20™ from the company CLARIANT) in dibutyl ether under vigorous stirring.

The suspension obtained is then sprayed onto the inner surface of the crucible, then a pyrolysis is carried out in air for 2 hours at 1000° C., preceded by a low-temperature annealing (150° C. for 2 hours).

This series of steps (spraying/low-temperature annealing/pyrolysis) is repeated 4 times in order to obtain the final layer. The layer deposited has a thickness of around 125 μm estimated by optical microscopy.

Formation of a Silicon Ingot in the Crucible Having the Coating

The crucible according to the invention thus formed is tested as follows:

800 g of electronic quality solid silicon are then placed manually and very carefully in the resulting crucible, then melted according to the following cycle: temperature increase at a rate of 250° C. per hour up to 800° C. under low vacuum, followed by a hold for a duration of one hour with introduction of a static argon atmosphere, then temperature increase at a rate of 150° C. per hour up to 1500° C. and maintenance at this temperature for 6 hours, and finally decrease at a rate of 50° C. per hour down to 1200° C. The cooling then takes place freely down to ambient temperature.

After complete cooling, the silicon ingot thus formed detaches from the crucible in accordance with the invention without any effort and without exhibiting any cracks.

Example 3

The crucible is the same as above.

Preparation of the Particulate Material

The particulate material is obtained from the milling of a solid mass of polysilazanes (Ceraset PSZ20™ from the company CLARIANT), polymerized under argon at 200° C. for 2 hours then pyrolyzed under argon for one hour at 1000° C., by a planetary mill (PM100 from the company Retsch) the components of which are made of ultra pure agate.

The powder obtained consists of amorphous grains of SiNCO composition. The SEM (scanning electron microscope) technique demonstrated that less than a quarter of the total population has dimensions greater than 10 μm.

Formation of the Crucible Coating

A multi-strata layer according to the invention or else a stack of non-touching tiles according to the invention was formed on this crucible, according to the following protocol.

The powder previously formed is dispersed in a solution (in a powder/solution volume ratio of 50/50) containing 50% by weight of polysilazane (Ceraset PSZ20™ from the company CLARIANT) in dibutyl ether under vigorous stirring. The suspension obtained is then sprayed onto the inner surface of the crucible, then a pyrolysis is carried out in air for 2 hours at 1000° C., preceded by a low-temperature annealing (150° C. for 2 hours).

This series of steps (spraying/low-temperature annealing/pyrolysis) is repeated twice in order to obtain the final layer. The layer deposited has a thickness of around 65 μm estimated by optical microscopy.

Formation of a Silicon Ingot in the Crucible Having the Coating

The crucible according to the invention thus formed is tested as follows:

800 g of electronic quality solid silicon are then placed manually and very carefully in the resulting crucible, then melted according to the following cycle: temperature increase at a rate of 200° C. per hour up to 1000° C. under low vacuum, followed by a hold for a duration of one hour with introduction of a circulating argon atmosphere (flow rate 0.7 l/min), then temperature increase at a rate of 100° C.

per hour up to 1470° C. and maintenance at this temperature for 5 hours, and finally decrease at a rate of 100° C. per hour down to 1000° C. The cooling then takes place freely down to ambient temperature.

After complete cooling, the silicon ingot thus formed detaches from the crucible in accordance with the invention without any effort and without exhibiting any cracks.

Example 4

The crucible used is a crucible made of 2320PT grade graphite coated with SiC (thickness 100 to 150 µm) fabricated by the company Mersen, having the same dimensions as above.

Preparation of the Particulate Material

The particulate material used is the $Si_3N_4$ powder sold under the reference SNE10® by the company UBE.

Formation of the Crucible Coating

A multi-strata layer according to the invention or else a stack of non-touching tiles according to the invention was formed on this crucible, according to the following protocol.

The powder cited above is dispersed in a solution (in a powder/solution volume ratio of 50/50) containing 50% by weight of polysilazane (Ceraset PSZ20™ from the company CLARIANT) in dibutyl ether under vigorous stirring. The suspension obtained is then sprayed onto the inner surface of the crucible, then a pyrolysis is carried out in air for 2 hours at 1000° C., preceded by a low-temperature annealing (150° C. for 2 hours).

This series of steps (spraying/low-temperature annealing/pyrolysis) is repeated twice in order to obtain the final layer. The layer deposited has a thickness of around 125 µm estimated by optical microscopy.

Formation of a Silicon Ingot in the Crucible Having the Coating

The crucible according to the invention thus formed is tested as follows:

800 g of electronic quality solid silicon are then placed manually and very carefully in the resulting crucible, then melted according to the following cycle: temperature increase at a rate of 250° C. per hour up to 800° C. under low vacuum, followed by a hold for a duration of one hour with introduction of a static argon atmosphere, then temperature increase at a rate of 150° C. per hour up to 1500° C. and maintenance at this temperature for 6 hours, and finally decrease at a rate of 50° C. per hour down to 1200° C. The cooling then takes place freely down to ambient temperature.

After complete cooling, the silicon ingot thus formed detaches from the crucible in accordance with the invention without any effort and without exhibiting any cracks.

Example 5

Analysis of the Purity of the Ingots Obtained

By way of comparison, a control ingot is molded in a crucible made of sintered silica coated with a standard coating based on $Si_3N_4$.

The ingots obtained in examples 1 to 4 and the control ingot are cut into vertical wafers having a thickness of 20 mm and lifetime analyses of the minority carriers in these wafers are carried out.

The principle of this measurement is the following: a pulsed laser excitation of the surface (to a depth of 1 mm) makes it possible to generate electron-hole pairs in the semiconductor material that will recombine after a characteristic time (lifetime) which is highly dependent on the amount of impurities present, resulting from the materials of the crucible. The mapping of the lifetimes in the wafers of the ingots is carried out by a measurement of the decrease of photoconductivity, induced by the generation of these charge carriers, and it is carried out on a WT200 machine from Semilab.

These analyses prove that the silicon formed with the crucibles from examples 1 to 4 in accordance with the invention has lifetimes, and therefore a purity, that are much better than the (control) silicon formed in a crucible having the standard non-stick coating. The thickness of the polluted zone is estimated at around 20 mm in the control ingot whereas it is between 2 and 10 mm in the ingots molded in coated crucibles according to the invention.

Example 6

The crucible used is a crucible made of sintered silica (Zyarock™) from the company Vesuvius, having an internal diameter of 150 mm and an internal height of 150 mm.

Preparation of the Particulate Material

The particulate material is obtained from the milling of a solid mass of polysilazanes (Ceraset PSZ20™ from the company CLARIANT), polymerized under argon at 200° C. for 2 hours then pyrolyzed under argon for one hour at 1000° C., by a planetary mill (PM100 from the company Retsch) the components of which are made of ultra pure agate.

The powder obtained consists of amorphous grains of SiNCO composition. The SEM (scanning electron microscope) technique demonstrated that less than a quarter of the total population has dimensions greater than 10 µm.

Formation of the Crucible Coating

A multi-strata layer according to the invention or else a stack of non-touching tiles according to the invention was formed on this crucible, according to the following protocol.

The powder previously formed is dispersed in a solution (in a powder/solution volume ratio of 50/50) containing 50% by weight of polysilazane (Ceraset PSZ20™ from the company CLARIANT) in dibutyl ether under vigorous stirring.

A stratum is then formed in the following manner:
spraying of the suspension obtained onto the inner surface of the crucible,
low-temperature annealing (150° C. for 2 hours), and pre-pyrolysis at 500° C. for 30 minutes,
reproducing 4 times the series of preceding steps so as to obtain 4 sub-strata, the pyrolysis of which in air for 2 hours at 1000° C. leads the formation of the expected stratum.

This series of steps (formation of 4 sub-strata/pyrolysis) is repeated twice in order to obtain the final layer. The layer deposited has a thickness of around 100 µm estimated by optical microscopy.

Formation of a Silicon Ingot in the Crucible Having the Coating

The crucible according to the invention thus formed is tested as follows:

800 g of electronic quality solid silicon are then placed manually and very carefully in the resulting crucible, then melted according to the following cycle: temperature increase at a rate of 200° C. per hour up to 1000° C. under low vacuum, followed by a hold for a duration of one hour with introduction of a circulating argon atmosphere (flow rate 0.7 l/min), then temperature increase at a rate of 100° C. per hour up to 1470° C. and maintenance at this temperature for 5 hours, and finally decrease at a rate of 100° C. per hour down to 1000° C. The cooling then takes place freely down to ambient temperature.

After complete cooling, the silicon ingot thus formed detaches from the crucible in accordance with the invention without any effort and without exhibiting any cracks.

REFERENCES

[1] Buonassisi et al., "Transition metals in PV-grade ingot-cast multicrystalline silicon: Assessing the role of impurities in $Si_3N_4$ crucible lining material", *J. Crystal Growth* 287 (2006) 402-407.
[2] T. Ohishi, "Gas barrier characteristics of a polysilazane film formed on an ITO-coated PET substrate", *J. Non-Crystalline Solids* 330 (2003) 248-251.
[3] Kojima et al., "Characteristics of polysilazane compound and its application as coating for carbon material", *J. Materials Science Letters* 21 (2002) 757-760.
[4] EP 0 411 611
[5] Bill J. et al., "Polymer-derived ceramic coatings on C/C—SiC composites", *J. European Ceramic Society*, 16 (1996) 1115-1120.
[6] T.-H. Ho et al., "Modification of epoxy resins with polysiloxane thermoplastic polyurethane for electronic encapsulation", *Polymer*, 37 (1996) 2733-2742.
[7] C. Vakifahmetoglu et al., "Ceramic foams and microbeads from emulsions of a preceramic polymer", *J. European Ceramic Society* 31 (2011) 1481-1490.

The invention claimed is:

1. A crucible useful for solidifying a silicon ingot from molten silicon, wherein it is coated at least partially on its inner surface with an outer layer that is in the form of a stack of strata, each stratum having a thickness varying from 5 to 150 μm, and being formed from a material obtained by thermal decomposition of polysilazane(s) and/or polysiloxane(s) and in which inorganic particles having a size that varies from 50 nm to 200 μm are incorporated.

2. The crucible as claimed in claim 1, wherein the dimensions of said inorganic particles vary from 500 nm to 50 μm.

3. The crucible as claimed in claim 1, wherein said inorganic particles are selected from silicon particles that are optionally surface oxidized, boron nitride particles, silicon nitride particles, silicon carbide particles, silicon oxycarbide particles, silica particles, silicon oxycarbonitride particles, silicon and boron carbonitride particles, and mixtures thereof.

4. The crucible as claimed in claim 1, wherein said inorganic particles are of the same chemical nature as the material forming the stratum or the strata containing them.

5. The crucible as claimed in claim 1, wherein the outer layer comprises from 2 to 8 strata, said strata being superposed and contiguous.

6. The crucible as claimed in claim 1, wherein the thickness of a stratum varies from 10 μm to 50 μm.

7. The crucible as claimed in claim 1, wherein the material obtained by thermal decomposition of polysilazane(s) and/or or polysiloxane(s) is based on silicon carbide, silicon nitride, silica, silicon oxycarbonitride and/or silicon oxycarbide.

8. The crucible as claimed in claim 1, wherein one or more of the strata constituting said layer, is/are formed from a material obtained by thermal decomposition of polysilazane(s), in which inorganic particles are incorporated.

9. The crucible as claimed in claim 8, wherein said inorganic particles are silicon oxycarbide particles.

10. The crucible as claimed in claim 8, wherein said inorganic particles are particles formed predominantly from silica.

11. The crucible as claimed in claim 1, wherein all of the strata constituting said layer are formed from one and the same material.

12. The crucible as claimed in claim 1, wherein at least two strata of said layer are formed from different materials.

13. The crucible as claimed in claim 1, wherein one or more of the strata forming the outer layer, are in the form of non-touching tiles.

14. The crucible as claimed in claim 13, wherein said tiles of one stratum are spaced out laterally by 0.1 μm to 50 μm.

15. The crucible as claimed in claim 1, wherein the outer layer has a thickness ranging from 10 μm to 500 μm.

16. The crucible as claimed in claim 1, wherein it consists of a dense ceramic substrateor of a porous substrate optionally covered with an impermeabilizing layer.

17. A process for forming a high-purity non-stick coating on the inner surface of a crucible useful for solidifying a silicon ingot from molten silicon, wherein said coating is obtained via
  (a) the formation of at least one stratum according to a treatment comprising:
    (1) at least once the sequence of the steps:
      (i) bringing the inner surface of said crucible into contact with a solution comprising at least one polysilazane and/or one polysiloxane, and additionally containing a particulate material, the particles of which have a size varying from 50 nm to 200 μm, in particulate material/polysilazane and/ or polysiloxane proportions ranging from 10% to 70% by volume;
      (ii) condensation-crosslinking of said solution by heat treatment; and
      (iii) optionally a pre-pyrolysis in air at a temperature ranging from 270° C. to 700° C.;
    (2) a pyrolysis under controlled atmosphere and controlled temperature, at a temperature above 700° C. for at least 1 hour and, optionally;
    (3) an oxidation annealing; followed by
  (b) the superposing of one or more consecutive strata on the stratum formed in step (a), each stratum being formed by repeating at least once the sequence of steps (i), (ii) and optionally (iii), followed by step (2) and optionally step (3).

18. The process as claimed in claim 17, wherein the formation of at least one of said strata comprises the pre-pyrolysis step (iii).

19. The process as claimed in claim 18, wherein the pre-pyrolysis step (iii) is carried out at a temperature ranging from 400° C. to 600° C.

20. The process as claimed in claim 18, wherein the formation of at least one stratum involving the implementation of steps (i), (ii) and (iii) comprises, prior to the implementation of step (2), the repetition, at least once, of steps (i), (ii) and (iii).

21. The process as claimed in claim 17, wherein the pyrolysis step (2) of one of steps (a) and (b) is carried out under a reactive atmosphere, which is reactive with respect to the material that is derived from the polysilazane and/or polysiloxane, the other step being carried out under an inert atmosphere.

22. The process as claimed in claim 17, wherein the solution comprising at least one polysilazane and/or one polysiloxane also comprises a solvent and, where appropriate, a polymerization initiator.

23. The process as claimed in claim 17, wherein said solution of polysilazane and/or polysiloxane comprises from 10% to 90% by weight of polysilazane(s) and/or polysiloxane(s), with respect to its total weight.

* * * * *